United States Patent [19]

Assar et al.

[11] Patent Number: 5,388,083
[45] Date of Patent: Feb. 7, 1995

[54] FLASH MEMORY MASS STORAGE ARCHITECTURE

[75] Inventors: Mahmud Assar, Morgan Hill; Siamack Nemazie, San Jose; Petro Estakhri, Pleasonton, all of Calif.

[73] Assignee: Cirrus Logic, Inc., Fremont, Calif.

[21] Appl. No.: 38,668

[22] Filed: Mar. 26, 1993

[51] Int. Cl.$^6$ ............................................. G11C 7/00
[52] U.S. Cl. ................................. 365/218; 365/900; 365/230.03; 365/185
[58] Field of Search ........... 365/218, 900, 185, 230.03, 365/200

[56] References Cited

U.S. PATENT DOCUMENTS

| | | | |
|---|---|---|---|
| 4,943,962 | 7/1990 | Imamiya et al. | 365/230.08 |
| 5,034,926 | 7/1991 | Tanra et al. | 365/218 |
| 5,043,940 | 8/1991 | Harari | 365/168 |
| 5,053,990 | 10/1991 | Kreifels et al. | 364/900 |
| 5,065,364 | 11/1991 | Atwood et al. | 365/185 |
| 5,095,344 | 3/1992 | Harari | 357/23.5 |
| 5,134,589 | 7/1992 | Hamano | 365/238.5 |
| 5,138,580 | 8/1992 | Farrugia et al. | 365/218 |
| 5,155,705 | 10/1992 | Goto et al. | 365/218 |
| 5,163,021 | 11/1992 | Mehrotra | 365/185 |
| 5,168,465 | 12/1992 | Harari | 257/320 |
| 5,172,338 | 12/1992 | Mehrotra et al. | 365/185 |
| 5,270,979 | 12/1993 | Harari et al. | 365/185 |
| 5,303,198 | 4/1994 | Adachi et al. | 365/218 |
| 5,341,339 | 8/1994 | Wells | 365/218 |
| 5,341,368 | 8/1994 | Henning et al. | 370/58.1 |

FOREIGN PATENT DOCUMENTS

| | | | |
|---|---|---|---|
| 0424191A2 | 9/1990 | European Pat. Off. | 11/00 |
| 0489204A1 | 12/1990 | European Pat. Off. | 16/06 |
| 0509184A1 | 4/1991 | European Pat. Off. | 16/06 |
| 0501289A2 | 2/1992 | European Pat. Off. | 16/06 |
| 0509330A2 | 4/1992 | European Pat. Off. | 3/06 |
| 4214184A1 | 11/1992 | Germany | 12/00 |
| 4215063A1 | 11/1992 | Germany | 16/00 |
| 59-45695 | 3/1984 | Japan | 17/00 |
| 62-283496 | 12/1987 | Japan | 17/00 |
| 62-283497 | 12/1987 | Japan | 17/00 |
| 4332999 | 11/1992 | Japan | 365/218 |

OTHER PUBLICATIONS

T. Nozaki et al., "A 1-Mb EEPROM with MONOS Memory Cell for Semicoductor Disk Application," IEEE Journal of Solid-State Circuits, vol. 26, No. 4, pp. 497-501, Apr. 1991.

S. Leibson, "Nonvolatile in-circuit-reprogrammable memories," EDN, Jan. 3, 1991, pp. 89-102.

W. Lahti and D. McCarron, "Store Data in a Flash," BYTE, Nov. 1990, pp. 311-318.

D. Auclair, "Optimal Solid State Disk Architecture For Portable Computers," SunDisk, presented at The Silicon Valley PC Design Conference, Jul. 9, 1991.

S. Mehroura et al., "Serial 9Mb Flash EEPROM for Solid State Disk Applications," 1992 Symposium on VLSI Circuits Digest of Technical Papers, pp. 24-25.

Kai Hwang & Faye A. Briggs, "Computer Architecture and Parallel Processing", McGraw-Hill, p. 64, 1984.

*Primary Examiner*—Eugene R. LaRoche
*Assistant Examiner*—Tan Nguyen
*Attorney, Agent, or Firm*—Haverstock, Medlen & Carroll

[57] ABSTRACT

A semiconductor mass storage system and architecture can be substituted for a rotating hard disk. The system and architecture avoid an erase cycle each time information stored in the mass storage is changed. (The erase cycle is understood to include, fully programming the block to be erased, and then erasing the block.) Erase cycles are avoided by programming an altered data file into an empty mass storage block rather than over itself as hard disk would. Periodically, the mass storage will need to be cleaned up. Secondly, all blocks in the mass storage are used evenly. These advantages are achieved through the use of several flags, a map to correlate a logical address of a block to a physical address of that block and a count register for each block. In particular, flags are provided for defective blocks, used blocks, old version of a block, a count to determine the number of times a block has been erased and written and erase inhibit flag.

24 Claims, 8 Drawing Sheets

FLASH MEMORY MASS STORAGE ARCHITECTURE

FIELD OF THE INVENTION

This invention relates to the field of mass storage for computers. More particularly, this invention relates to an architecture for replacing a hard disk with a semiconductor non-volatile memory and in particular flash memory.

BACKGROUND OF THE INVENTION

Computers have used rotating magnetic media for mass storage of data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that flash memory is preferred for such a replacement. It should be noted that $E^2$ PROM is also suitable as a replacement for a hard disk drive.

Flash memory is a single transistor memory cell which is programmable through hot electron injection and erasable through Fowler-Nordheim tunneling. The programming and erasing of such a memory cell requires current to pass through the dielectric surrounding a floating gate electrode. Because of this, such types of memory have a finite number of erase-write cycles. Eventually, the dielectric will fail. Manufacturers of flash cell devices specify the limit for the number erase-write cycles as between 10,000 and 100,000. Accordingly, unlike rotating magnetic media, a flash memory mass storage device does not have an indefinite lifetime.

Another requirement for a semiconductor mass storage device to be successful is that its use in lieu of a rotating media hard disk mass storage device be transparent to the system designer and the user. In other words, the designer of a computer incorporating such a semiconductor mass storage device could simply remove the hard disk and replace it with a semiconductor mass storage. All presently available commercial software should operate on a system employing such a semiconductor hard disk without the necessity of any modification.

SunDisk proposed an architecture for a semiconductor mass storage using flash memory at the Silicon Valley PC Design Conference Jul. 9, 1991. That mass storage system included read-write block sizes of 512 Bytes (or multiples thereof) just like IBM PC compatible hard disk sector sizes. (IBM PC is a trademark of IBM Corporation.) During an erase cycle, an entire block is first fully programmed and then erased.

As in conventional hard disks, it appears in the SunDisk architecture that there is an erase-before-write cycle each time data is changed in the mass storage. Thus, if a program or data block is to be changed, the data is written to RAM and appropriately changed, the flash block is fully programmed, then erased and then reprogrammed to the new memory condition. Unlike a hard disk device, in a flash memory device an erase cycle is slow which can significantly reduce the performance of a system utilizing flash memory as its mass storage.

Though such an architecture provides a workable semiconductor mass storage, there are several inefficiencies. First of all, each time a memory block is changed, there is a delay to the entire system due to the necessary erase-before-write cycle before reprogramming the altered information back into the block. The overhead associated with erase-before-write cycles is costly in terms of system performance.

Secondly, hard disk users typically store both information which is rarely changed and information which is frequently changed. For example, a commercial spread sheet or word processing software programs stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a flash memory device, this variance can cause sections of the mass storage to wear out and be unusable significantly sooner than other sections of the mass storage.

SUMMARY OF THE INVENTION

The present invention discloses two primary algorithms and an associated hardware architecture for a semiconductor mass storage device. It will be understood that data file in this patent document refers to any computer file including commercial software, a user program, word processing software document, spread sheet file and the like. The first algorithm provides means for avoiding an erase-before-write cycle when writing a modified data file back onto the mass storage device. Instead, no erase is performed and the modified data file is written onto an empty portion of the mass storage. In addition, the second algorithm prevents any portion of the mass storage from being erased a substantially larger number of times than any other portion. This prevents any one block of the mass storage from failing and becoming unusable earlier than any other block thereby extending the life of the entire mass storage.

The semiconductor mass storage architecture has blocks sized to conform with commercial hard disk sector sizes. The blocks are individually erasable. In one embodiment, the semiconductor mass storage of the present invention can be substituted for a rotating hard disk with no impact to the user, so that such a substitution will be transparent. Means are provided for avoiding the erase-before-write cycle each time information stored in the mass storage is changed. (The erase cycle is understood to include, fully programming each bit in the block to be erased, and then erasing all the bits in the block.)

According to the first algorithm, erase cycles are avoided by programming an altered data file into an empty mass storage block rather than over itself after an erase cycle of that block as done on a conventional hard disk. This would ordinarily not be possible when using conventional mass storage because the central processor and commercial software available in conventional computer systems are not configured to track continually changing physical locations of data files. The present invention includes a programmable map to maintain a correlation between the logical address 308 and the physical address 408 of the updated information files.

Periodically, the mass storage will fill up because there have been no erase cycles. At such times, the mass storage needs to be cleaned up with a multi-sector erase as fully described in the detailed description below.

According to the second algorithm, means are provided for evenly using all blocks in the mass storage. A counter tracks the number of times each block is erased. A programmable maximum value for the counter is also provided. As the number of erase cycles for a block becomes one less than the maximum, the block is erased one last time and written with another file having a then smallest number of erase cycles. It is also prevented from being erased thereafter by setting its erase inhibit flag. After all blocks approach this maximum, all the erase counters and inhibit flags are cleared and the second algorithm is then repeated. In this way, no block can be erased a substantial number of times more than any other block.

These advantages are achieved through the use of several flags and a count register for each block. In particular, flags are provided for defective blocks, used blocks, old version of a block, a count to determine the number of times a block has been erased and written and an erase inhibit flag.

DETAILED DESCRIPTION OF THE PREFERRED EMBODIMENT

Figure 1:
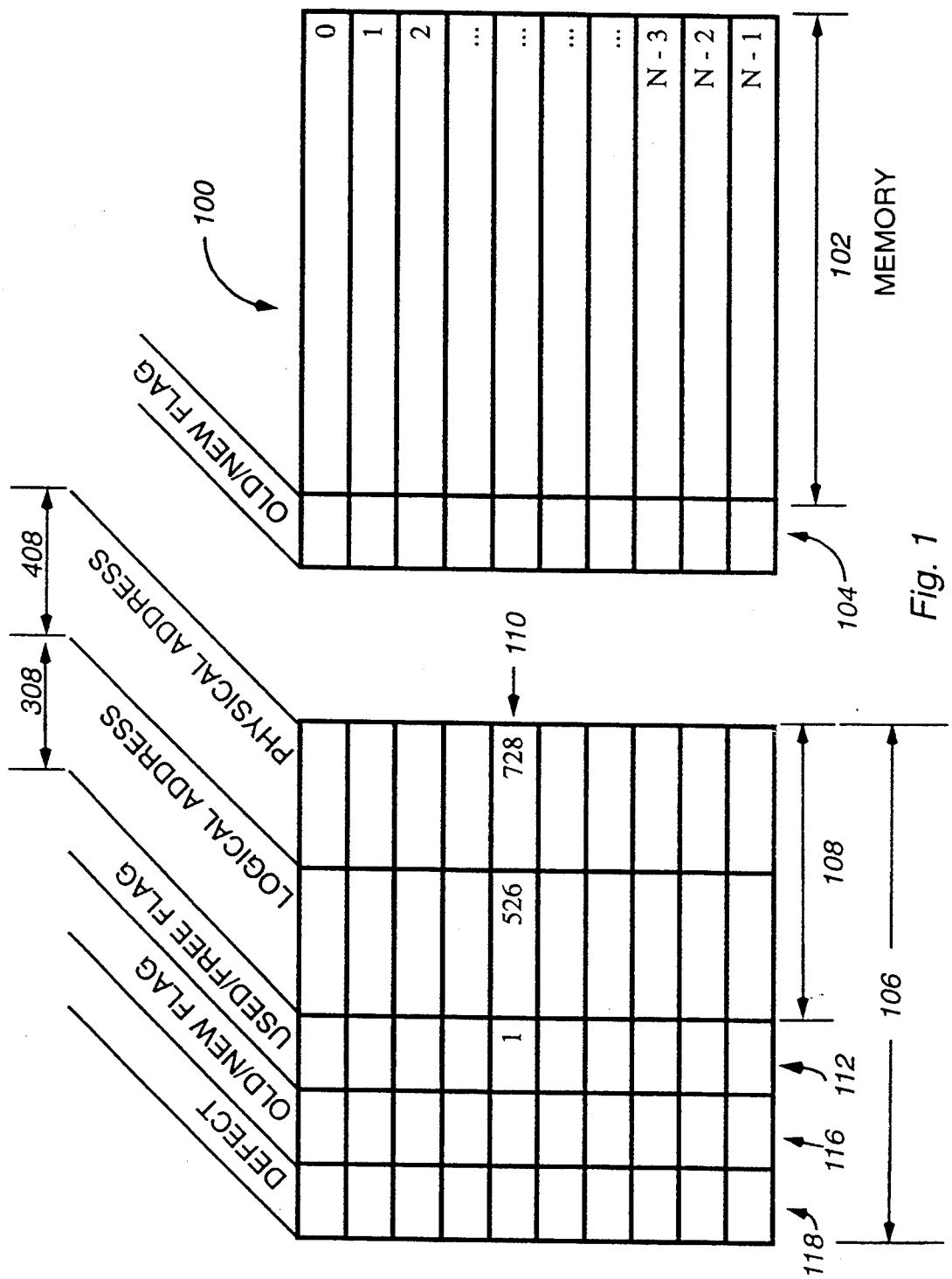
FIG. 1 shows an architecture for a semiconductor mass storage.

FIG. 1 shows an architecture for a semiconductor mass storage according to the present invention. In the preferred embodiment, all of the memory storage is flash EEPROM. It is possible to substitute $E^2PROM$ for some or all of the data bits shown. A memory storage 100 is arranged into N blocks of data from zero through N−1. Each of the blocks of data is M Bytes long. In the preferred embodiment, each block is 512 Bytes long to correspond with a sector length in a commercially available hard disk drive. In addition to the memory data block 102, a flag 104 is directly related to each data block 102. The memory 100 can contain as much memory storage as a user desires. An example of a mass storage device might include 100 MByte of addressable storage.

A non-volatile content addressable memory (CAM) 106 is associated with the memory storage 100. In the preferred embodiment, the CAM 106 is formed of flash memory. The CAM 106 can also be $E^2PROM$. There is one entry in the CAM 106 for every one of the N blocks in the mass storage 100. Each entry includes a number of fields which will be described below. The CAM 106 is also formed of a non-volatile memory because loss of its information would make retrieval of the data files stored in the mass storage 100 impossible.

As described above in the Background of the Invention, conventional computer systems are not configured to track continually changing physical locations of data files. According to the present invention, each time a data file is changed it is stored into a new physical location in the mass storage. Thus, implementation of the architecture of the present invention requires a mapping of the logical address 308, i.e., the address where the computer system believes the data file is stored to the physical address 408, i.e., the actual location the data file can be found is stored in the mass storage.

The logical address 308 portion of the map 108 and the flags 112, 116 and 118 form part of the CAM 106. It is possible to use other storage means than a CAM to store the address map, such as a look-up table. However, a CAM is the most efficient means known to the inventors. It is not necessary that the physical address 408 portion of the map 108 form part of the CAM. Indeed, the physical address 408 portion of the map 108 can be ordinary flash memory, $E^2PROM$ or even ROM. If ROM is selected for the physical address 408 array of the map 108, a defect in the ROM will prevent the block corresponding to that physical address 408 from ever being addressed. Accordingly, a changeable nonvolatile memory is preferred. Note that any replacement circuit for the CAM should be nonvolatile. Otherwise, loss or removal of power to the system will result in loss of the ability to find the data files in the mass storage.

Assume for example that a user is preparing a word processing document and instructs the computer to save the document. The document will be stored in the mass storage system as shown in FIG. 1. The computer system will assign it a logical address 308, for example 526H. The mass storage system of the present invention will select a physical address 408 of an unused block or blocks in the mass storage 100 for storing the document, e.g. 728H. That map correlating the logical address 308 to the physical address 408 is stored in the CAM 106. As the data is programmed, the system of the present invention also sets the used/free flag 112 to indicate that this block has been written without being erased. The used/free flag 112 also forms a portion of the CAM 106. One used/free flag 112 is provided for each entry of the CAM 106.

Figure 2:
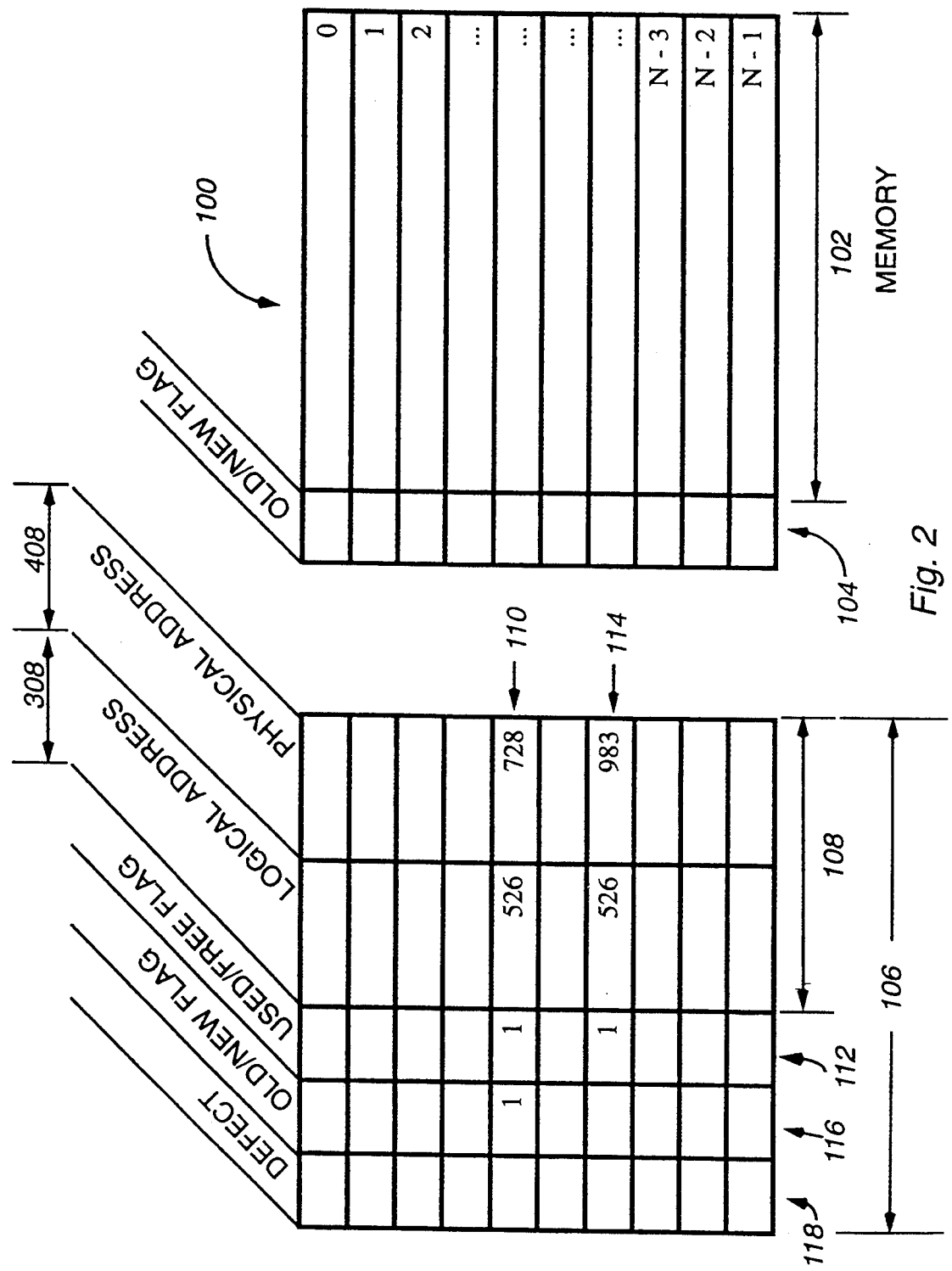
FIG. 2 shows the architecture of FIG. 1 wherein the data in one block has been altered and stored in a new physical address.

Later, assume the user retrieves the document, makes a change and again instructs the computer to store the document. To avoid an erase-before-write cycle, the system of the present invention provides means for locating a block having its used/free flag 112 unset (not programmed) which indicates that the associated block is erased. The system then sets the used/free flag for the new block 114 (FIG. 2) and then stores the modified document in that new block 114. Next, the system sets the old/new flag 116 of the previous version of the document indicating that this is an old unneeded version of the document. Lastly, the system updates the correlation between the logical address 308 and the actual physical address 408. In this way, the system of the present invention avoids the overhead of an erase cycle which is required in the erase-before-write of conventional systems to store a modified version of a previous document.

The writing to mass storage process outlined above is repeated until the entire mass storage memory 100 has been filled. A full mass storage is indicated by no unset used/free flags 112 in the CAM 106. At that time a multisector erase is necessary and those blocks in the memory 100 and their associated CAM 106 entries having an old/new flag 116 set are all erased simultaneously. Note that it is not necessary for 100% of the blocks to have a set used/free flag 112 for a multi-sector erase to occur. For example, if a data file requiring three blocks were being written and only two blocks having unset used/free flags 112 were available a multi-sector erase can be run.

A simultaneous erase is not needed with prior art implementations because those embodiments utilize an erase-before-write cycle rather than retaining superseded versions of data files. In such circuits a latch of volatile logic circuits is set to couple the voltage necessary to erase the flash cells in the block. Because of the likely large number of memory blocks in the mass storage 100, if the CAM 106 and mass storage 100 are on the same integrated circuit (chip) coupling the old/new flag 116 to the latches in parallel would typically be very expensive in terms of surface area of the chip and coupling the old/new flags 116 serially to the latches would be expensive in terms of system performance. If the CAM 106 and the mass storage 100 are on separate chips, it is doubtful that either device could have sufficient I/O capability to interconnect the old/new flags 116 to the latches in parallel and thus, the system would suffer from a serial transfer of that information for a multi-sector erase.

Because of these problems it is preferable that no updating of the latches be performed prior to an erase of all blocks having a set old/new flag 116. To avoid this step, a plurality of old/new flag systems 104 are intimately associated with each block in the memory 102 and is programmed by the same sequence of instructions as the old/new flag 116 of the CAM 106.

Figure 4:
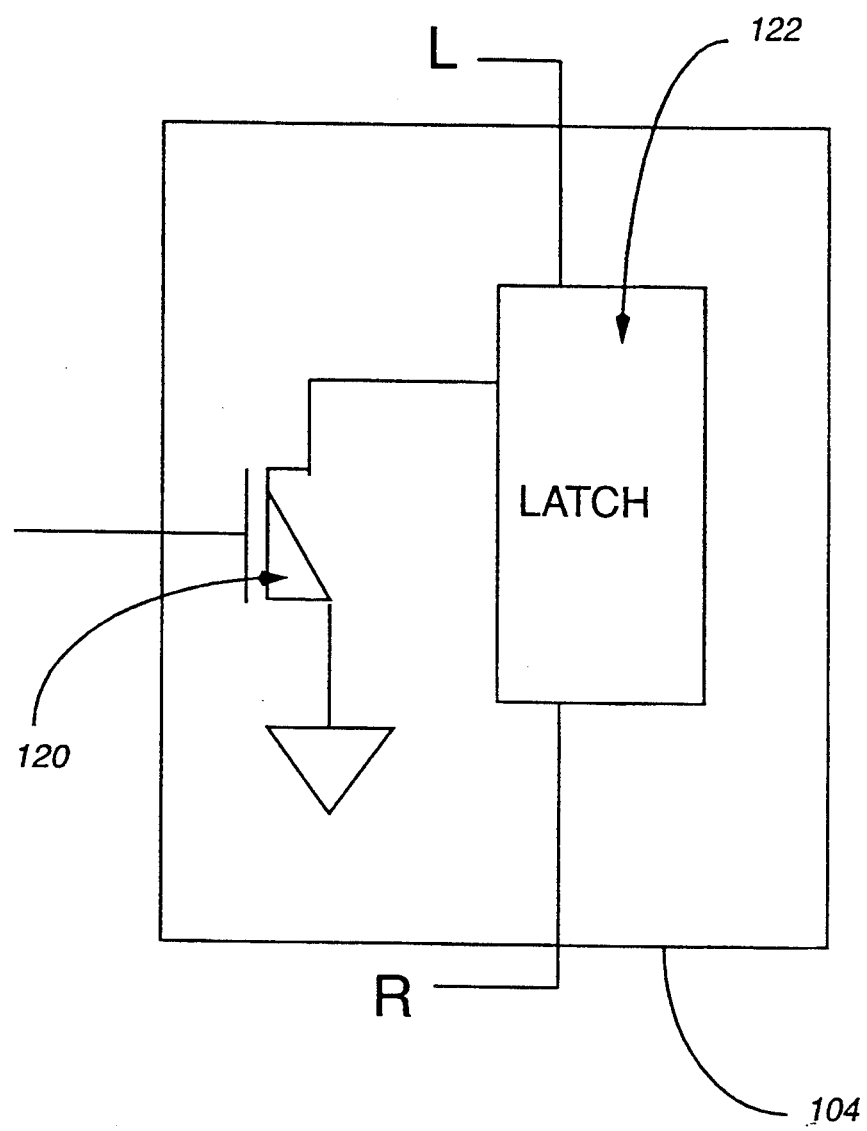
FIG. 4 shows a simplified block diagram of the old-/new flag system integrally formed with the memory.

FIG. 4 shows a simplified block diagram of the old/new flag system 104 which includes a non-volatile bit 120 having data which mirrors the old/new flag 116. In addition there is a volatile latch 122 coupled to receive the data in the bit 120 from the latch during an erase cycle. At the time of an erase, the data in each of the bits 120 is simultaneously coupled to each appropriate ones of the latches 122 under control of a load signal coupled to each latch 122 over a load line L. Upon receiving a signal to perform the erase, the latch for every block having its associated bit 120 set then couples the voltage necessary to perform an erase of that block and its associated bit 120. After the erase is complete and verified, all the latches 122 are individually reset to a predetermined state under control of a reset signal coupled to each latch 122 over a reset line R.

For certain applications of the present invention, especially for low power portable computers, a simultaneous erase of all blocks having their respective old/new flags set may be undesirable. For such applications, the blocks can be segregated into groups of blocks. Each group has a unique control line to load the latches from the nonvolatile bits. In this mode, during an erase cycle, the control lines are sequentially activated and the groups of blocks sequentially erased.

Figure 5:
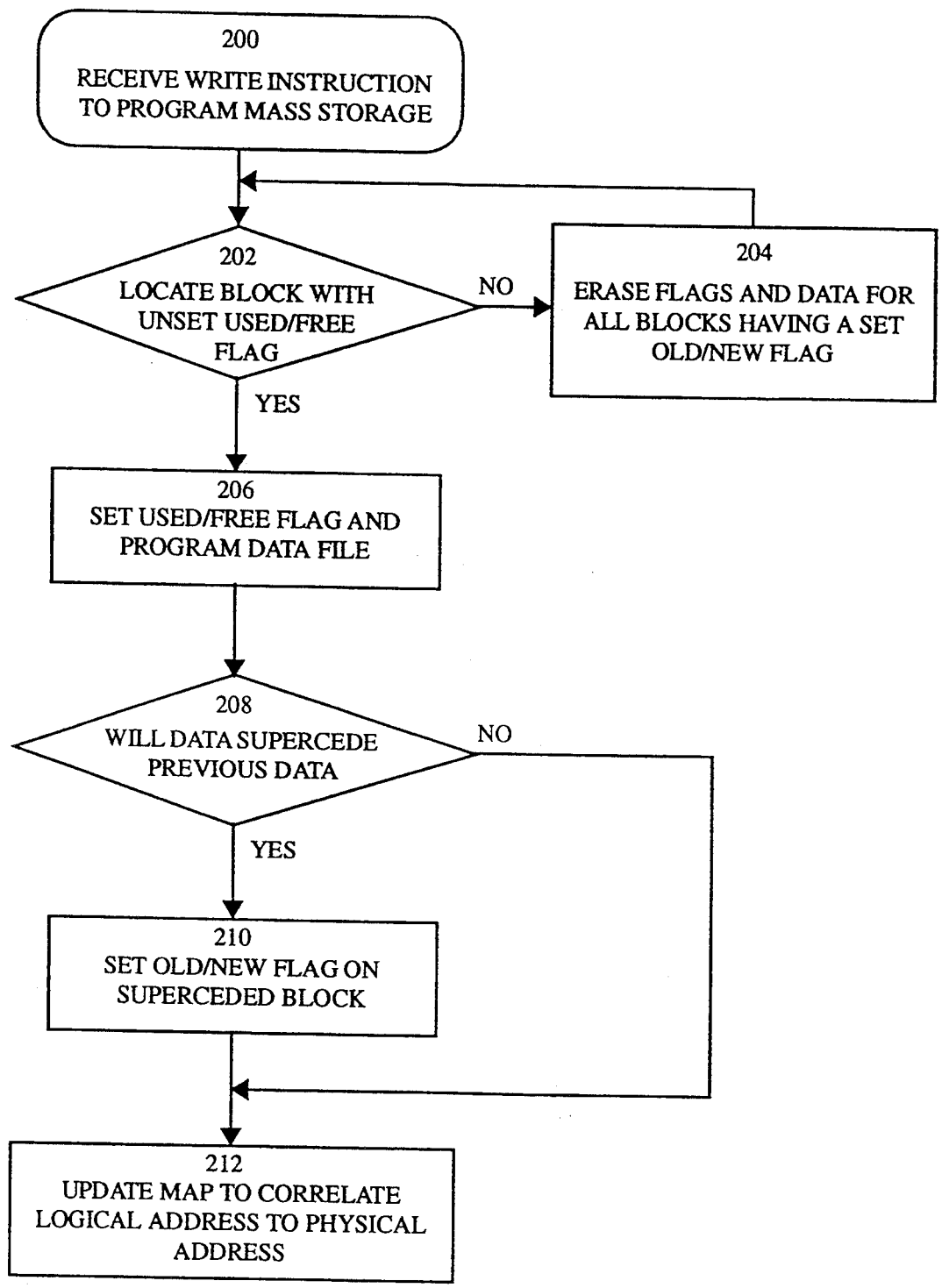
FIG. 5 shows a flow chart block diagram for algorithm 1.

FIG. 5 shows algorithm 1 according to the present invention. When the system of the present invention receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag (step 204) and then searches for a block having an unset used/free flag (step 202). Such a block has just been formed by step 204. The system then sets the used/free flag for that block and programs the data file into that block (step 206).

If the data file is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 308 to the physical address 408 is updated (step 212).

By following the procedure outlined above, the overhead associated with an erase cycle is avoided for each write to the memory 100 except for periodically. This vastly improves the performance of the overall computer system employing the architecture of the present invention.

In the preferred embodiment of the present invention, the programming of the flash memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 118 in the CAM 106 is set preventing that block from being used again.

Figure 3:
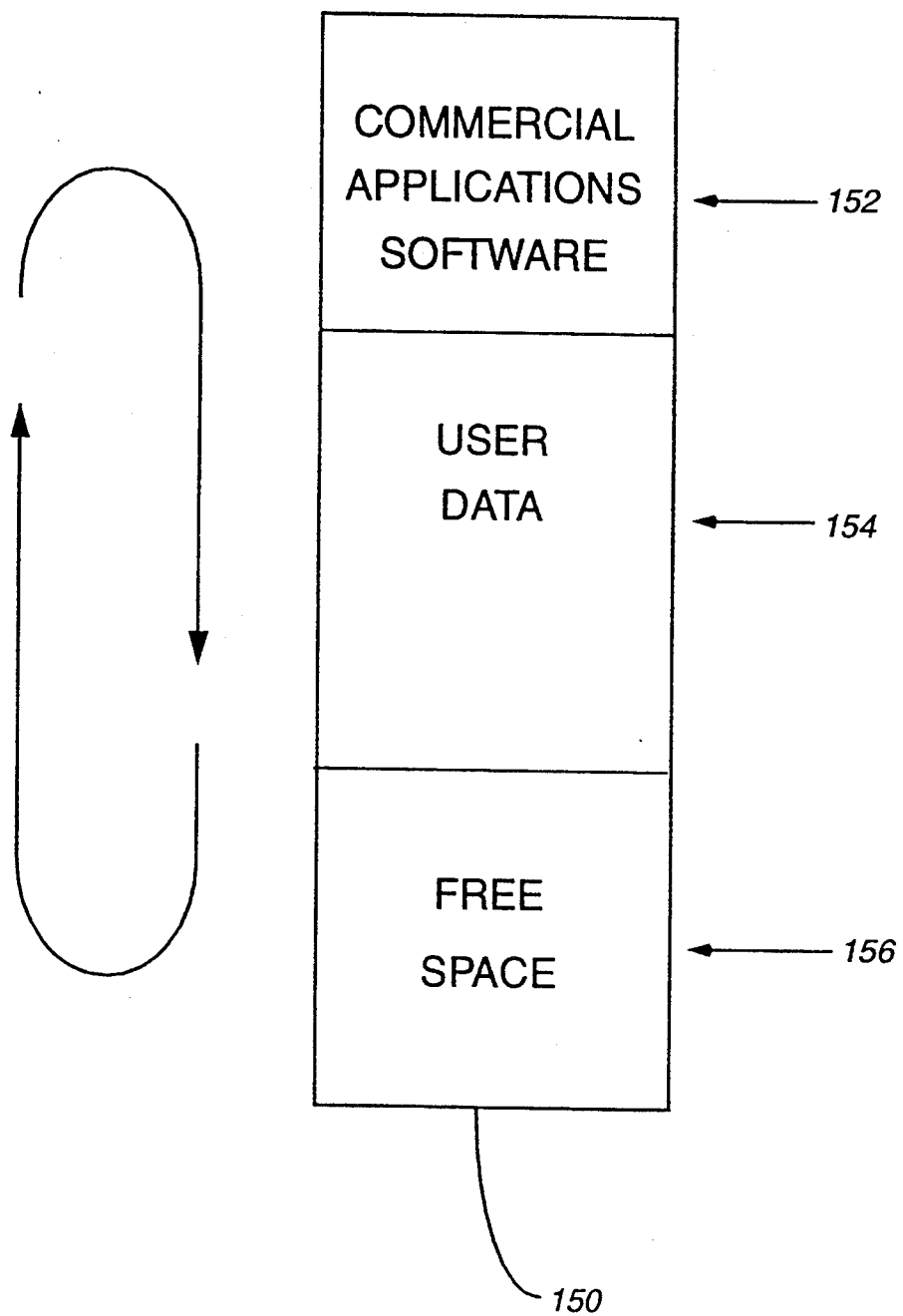
FIG. 3 shows a block diagram of an erase cycle usage according to algorithm 1 of the present invention.

In addition to saving the overhead of the erase cycle all but periodically, utilization of the present invention tends to more evenly distribute the erase cycles amongst certain portions of the blocks of the mass storage. FIG. 3 schematically shows the types of information stored in utilizing a mass storage media 150. One portion of the mass storage 150 contains commercial applications software 152 such as word processing, spreadsheet, calendaring, calculators and the like. These portions of the mass storage 150 rarely, if ever, require an erase-reprogram cycle according to the algorithm described above.

A second section of the mass storage 150 contains user data 154. The user data 154 is frequently altered requiring the information to be reprogrammed into blocks of the free space 156 under the algorithm described above. A third portion of the mass storage 150 contains free space 156 of unprogrammed blocks.

By following the algorithm above, the storage blocks in the portions 154 and 156 of the memory 150 will recycle data files and thus be erased and reprogrammed significantly more often than the commercial applications software portion 152 of the memory 150. Accordingly, the mass storage 150 will wear out more quickly in the user data 154 and the free space 156 sections of the memory requiring earlier replacement than in sections 152 of the mass storage having data files which are rarely changed. As the number of free blocks diminishes providing a smaller number of blocks through which to recycle data files, the remaining blocks become erased more frequently exacerbating the problem.

Figure 6:
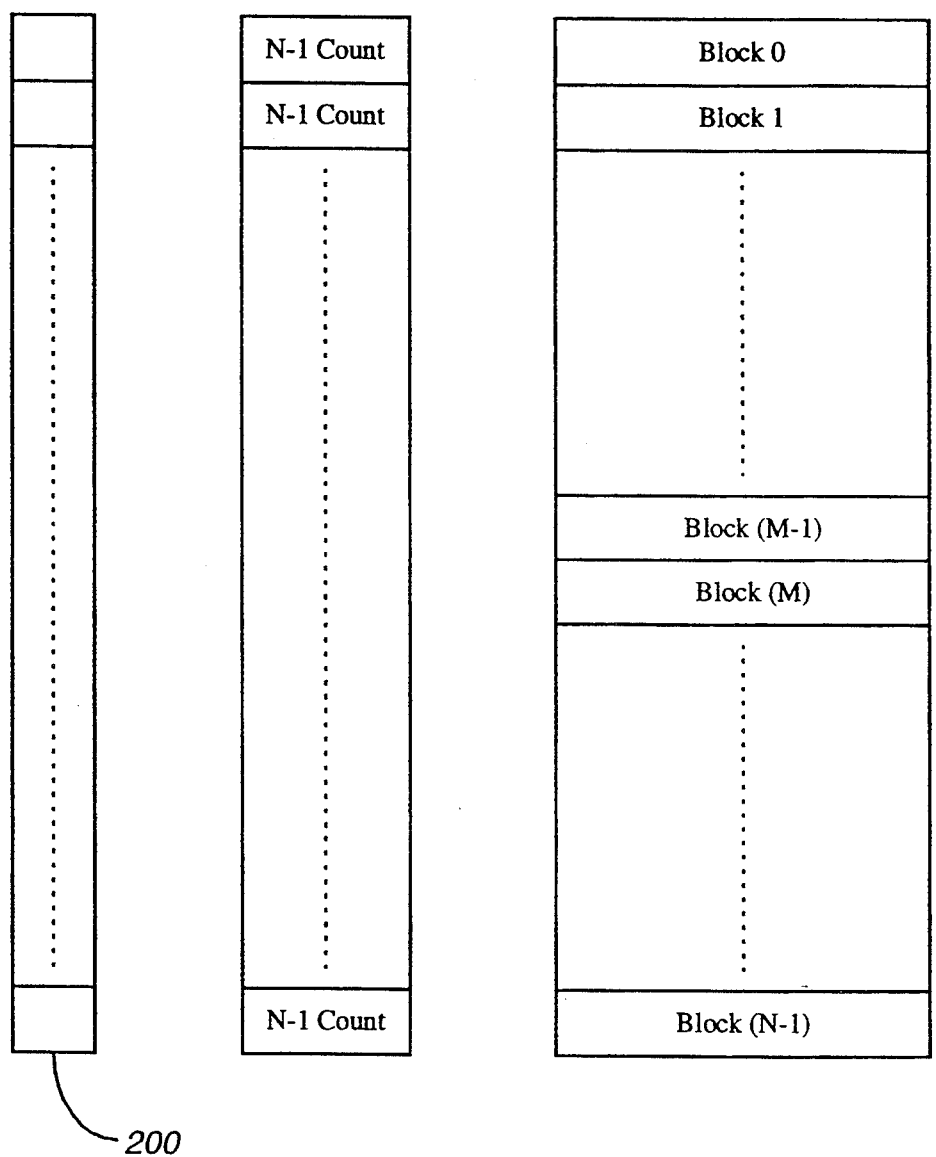
FIG. 6 shows an additional architecture according to the preferred embodiment of the present invention.

A second algorithm is provided for leveling erase cycles amongst all the blocks within the entire mass storage device as shown in FIG. 6. A counter is provided for each block to count the number of times each block has been erased and reprogrammed. An erase inhibit flag is also provided for each block. Once the erase count has reached the maximum for any block, the erase inhibit flag is set for that block. After that time that block cannot be erased until a clean-out erase is performed. Referring to FIG. 3, if only algorithm 1 is used eventually all of the blocks in the user data 154 and the free space 156 portions of the mass storage 150 will reach the maximum count and have their respective erase inhibit flags set. Because of this, a reallocation of the rarely erased data files stored in the memory 152 is made into the memory 154 and/or 156. In this way, sections of the mass storage which have been erased numerous times are programmed with a reallocated data file which is rarely changed thereby allowing all sections of the mass storage to eventually approach parity of erase cycles. Like the multi-sector erase, a clean-out erase can be performed in the event that there is insufficient available storage for a data file presently being performed. For example, if all but two blocks have their respective erase inhibit flags set, and a three or more block data file is being programmed, a clean-out erase can be performed to provide sufficient storage for the data file.

Once the erase inhibit flag is set for all the blocks, indicating that all the blocks have achieved parity in erase cycles, the erase inhibit and erase count registers are erased and the cycle is repeated. The selection of the maximum count depends upon the system requirements. As the value for the maximum count increases, the disparity between erase count cycles of various blocks can also increase. However, because data is shifted as a result of achieving maximum erase count this process of smoothing cycles throughout the mass storage of itself introduces additional erase cycles because a block of information is transferred from a physical block having few erases to a block having the maximum number of erases. Accordingly, though low maximum count values reduce the disparity between erase cycles amongst the blocks it also increases the number of erase cycles to which the blocks are subjected. Accordingly, individual users may select an erase count depending upon the system needs.

Figure 7:
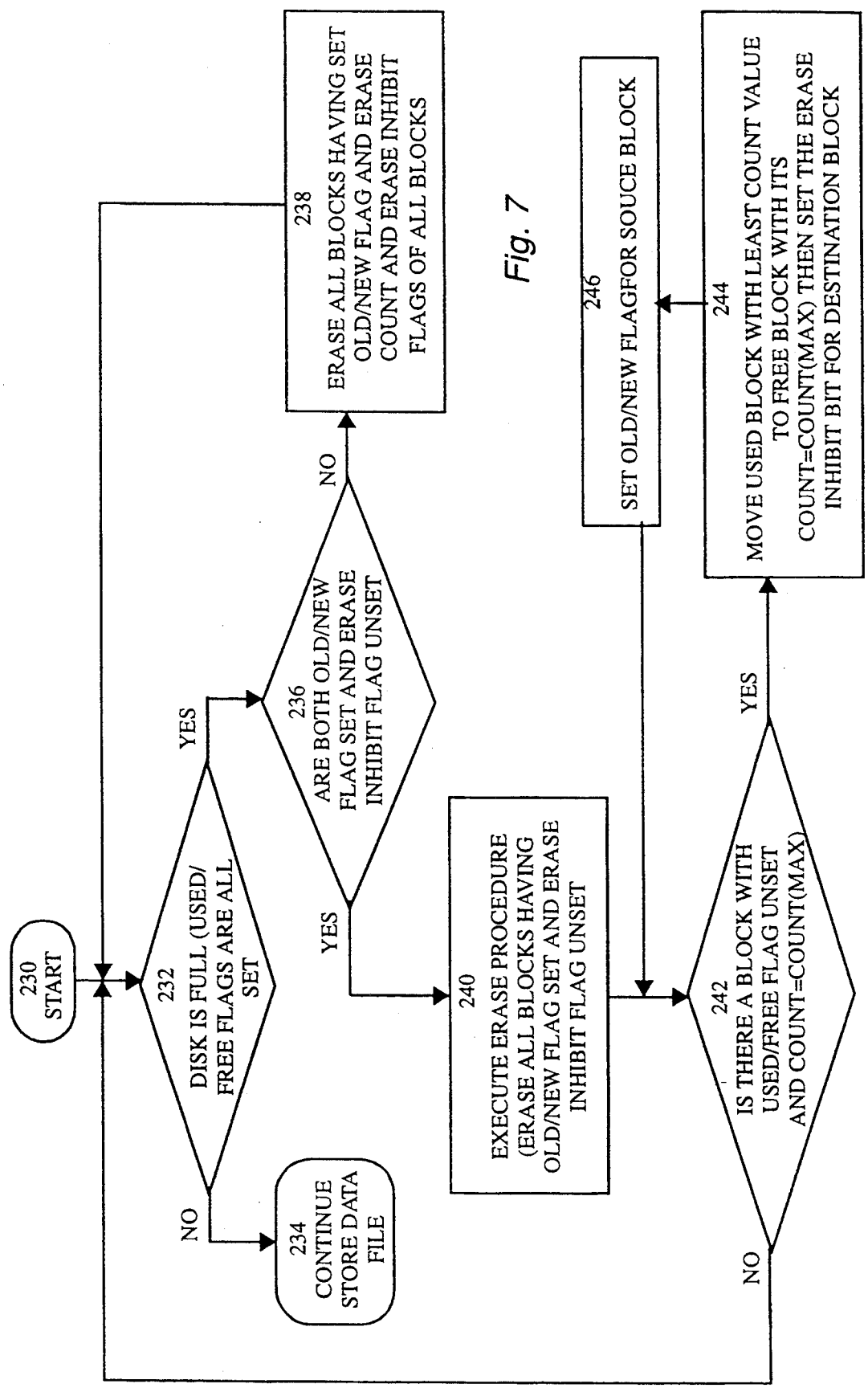
FIG. 7 shows a flow chart block diagram of algorithm 2 of the present invention.

In the preferred embodiment, algorithm 2 is merged with algorithm 1 as shown in FIG. 7. An instruction is provided by the computer system to write a data file to the mass storage (step 230) which starts the combined algorithm 1 and algorithm 2 sequence. It is first determined whether the mass storage is full (step 232). If the mass storage is not full, i.e., it has a block with its used/free flag unset, the algorithm continues and stores the data file into such a block (step 234).

If on the other hand, it is determined that there are no free blocks, then it is next determined whether there are any blocks which have both the old/new flag set AND the erase inhibit flag unset (step 236). If there are no blocks which have both the old/new flag set AND the erase inhibit flag unset (step 236), the system of the present invention erases the data file, used/free flag and old/new flag in each block having its old/new flag set, and erases the counter and erase inhibit flag for every block (step 238). Step 238 is also performed in the event there are insufficient blocks remaining to store a pending data file. The algorithm then returns to block (step 232) to determine whether the disk is full.

If the system can find a block having both the old/new flag set AND the erase inhibit flag unset (step 236), then the system executes an erase procedure and erases the data file, used/free flag and old/new flag in each block having its old/new flag set. The counter is incremented and the erase inhibit flag for such blocks is not disturbed.

It is then determined whether any block having its used/free flag unset has its counter at the maximum count (step 242). If not, then the system of the present invention returns to decision step 232 and investigates again whether there is any block having its used/free flag unset (step 232).

On the other hand, if there is a block having its erase count at the maximum value, a data file is copied from another block having the then least count value (step 244) into the location having COUNT=$COUNT_{MAX}$. The erase inhibit flag is then set (step 244). Note that a data file will not be copied from a block having its erase count at one less than the maximum value, $COUNT_{MAX}-1$. Making such a reallocation from a source block having $COUNT_{MAX}-1$ to a destination block having $COUNT_{MAX}$ results in having both blocks at $COUNT_{MAX}$ and no net gain. Further, the block previously having its erase count at $COUNT_{MAX}-1$ is erased to no advantage, thus the erase cycle for that block would be wasted.

The old/new flag from the source block is then set (step 246) so that it can be erased during the next execution of an erase step 240. In that way the source block can be used for storage until its erase count reaches maximum and its erase inhibit flag is set. The algorithm then returns to step 242 to determine whether there are now any blocks having an unset used/free flag with an erase count less than $COUNT_{MAX}$. It will be understood that each time a data file is programmed or moved according to the algorithm of FIG. 7 that the map in the CAM which correlates the logical address 308 to physical address 408 is updated so that the computer system can always access the data files.

The efficiency of these algorithms has been tested by simulation. In the simulation it was assumed that the mass storage was 50% filled with data files that are not changed, 30% with data files that are routinely changed and 20% empty. Of the 30% of the data files that are routinely changed, ⅔ are rewritten 70% of the time, ⅓ are rewritten 25% of the time and ⅓ are rewritten 5% of the time. The simulation showed that the algorithm 1 improves the number of cycles until any block has reached failure by between six and seven times and algorithm 2 by approximately two times over the improvement gained using algorithm 1 alone. Depending upon the design criterion of a target system, it is possible to utilize either algorithm 1, algorithm 2 or the preferred merged algorithm. Algorithm 1 and the merged algorithm have been described above.

In the preferred embodiment, a bit is programmed into the counter for each erase cycle rather than using binary counting. Thus, an eight bit counter register would only be able to count to eight. This avoids having to erase the counter and then reprogramming it with an incremented value as would be necessary for binary counting. This is preferred because it avoids having to temporarily store the count value for all of the blocks being erased. By programming a bit for each, the counter registers need not be erased until all the blocks reach maximum count and there is a general erase.

Because the mass storage apparatus of the present invention can accommodate large data storage, it is likely that many blocks will be flagged for a clean-out erase. Either a temporary volatile storage would be necessary for each block to store the previous count value prior to incrementing and reprogramming or the erase and updating of the counters would have to be done one after the other. One solution requires integrated circuit surface area and the other degrades performance. Note however, that if binary counting is desired the erase counter can be erased each time the block is erased and immediately reprogrammed. Because this will happen only during the periodic erase cycle described relative to the first algorithm some system designers may find this acceptable.

Figure 8:
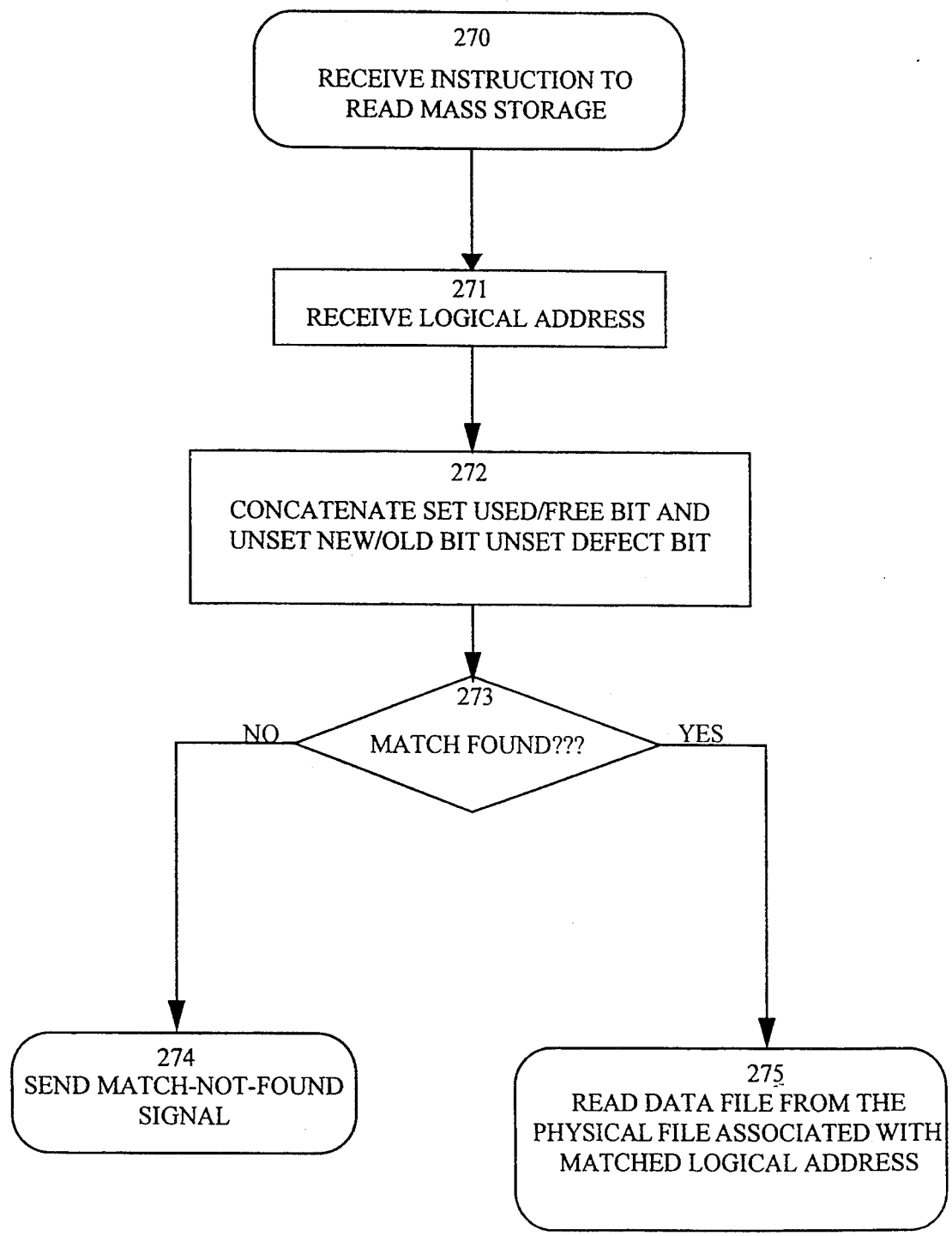
FIG. 8 shows a flow chart block diagram of a read algorithm according to the present invention.

The read algorithm according to the present invention is shown in FIG. 8. A read instruction is received by the mass storage apparatus of the present invention from the computer system (step 270). Concurrent with receiving the read instruction, the system also receives the logical address 308 of the data file needed by the computer system (step 271). The apparatus of the present invention concatenates all the appropriate flags to the logical address 308 including having a set used/free flag, and unset new/old and defect flags (step 272). If a match is found in the CAM (step 273), the data file is read (step 275) otherwise a signal is returned to the computer system that the data file was not found (step 274).

The present invention is described relative to a preferred embodiment. Modifications or improvements which become apparent to one of ordinary skill in the art after reading this disclosure are deemed within the spirit and scope of this invention.

What is claimed is:

1. A non-volatile semiconductor mass storage device comprising:
   a. a plurality of non-volatile storage blocks, wherein each block is selectively programmable to store data and is selectively erasable and further wherein each block has a finite number of erase cycle lifetimes; and
   b. means for ensuring no block is subjected to more than a predetermined larger number of erase cycles than any other block.

2. The device according to claim 1 wherein the means for ensuring comprises a counter for each block for counting each erase cycle to which that block has been subjected.

3. The device according to claim 2 wherein the counter includes a plurality of bits programmed by binary counting.

4. The device according to claim 2 wherein the counter includes a plurality of bits programmed by sequentially programming each bit, one at a time, wherein each programmed bit represents a count of one.

5. The device according to claim 2 further comprising means for setting a maximum count value which applies to all blocks, and further an erase inhibit flag having a set condition and an unset condition for each block for preventing further erases to a block having its erase inhibit flag in the set condition.

6. The device according to claim 5 further comprising:
   a. means for determining whether the counter for any erased block is equal to the maximum count value;
   b. means for finding a block having a count value less than the maximum count value; and
   c. means for moving the block having a count value less than the maximum count value into an erased block having its counter equal to the maximum count value.

7. The device according to claim 6 further comprising means for finding a block having a then least count value and moving that block into the erased block having its counter equal to the maximum count value.

8. The device according to claim 5 wherein the blocks, the counter and the flag are formed of flash memory cells.

9. The device according to claim 5 wherein the blocks, the counter and the flag are formed of $E^2PROM$ cells.

10. A non-volatile semiconductor mass storage device comprising:
    a. a plurality of non-volatile storage blocks, wherein each block is selectively programmable to store data and is selectively erasable and further wherein each block has a finite number of erase cycle lifetimes; and
    b. a controller to ensure no block is subjected to more than a predetermined larger number of erase cycles than any other block.

11. The device according to claim 10 wherein the controller comprises a counter for each block for counting each erase cycle to which that block has been subjected.

12. The device according to claim 11 wherein the counter includes a plurality of bits programmed by binary counting.

13. The device according to claim 11 wherein the counter includes a plurality of bits programmed by sequentially programming each bit, one at a time, wherein each programmed bit represents a count of one.

14. The device according to claim 11 further comprising means for setting a maximum count value which applies to all blocks, and further an erase inhibit flag having a set condition and an unset condition for each block for preventing further erases to a block having its erase inhibit flag in the set condition.

15. The device according to claim 12 further comprising:
    a. a first circuit to determine whether the counter for any erased block is equal to the maximum count value;
    b. a searcher to find a block having a count value less than the maximum count value; and
    c. a second circuit to move the block having a count value less than the maximum count value into an erased block having its counter equal to the maximum count value.

16. The device according to claim 15 further comprising means for finding a block having a then least count value and moving that block into the erased block having its counter equal to the maximum count value.

17. The device according to claim 12 wherein the blocks, the counter and the flag are formed of flash memory cells.

18. The device according to claim 12 wherein the blocks, the counter and the flag are formed of $E^2PROM$ cells.

19. A non-volatile semiconductor mass storage device comprising:
   a. a plurality of non-volatile storage blocks, wherein each block is selectively programmable to store data and is selectively erasable and further wherein each block has a finite number of erase cycle lifetimes;
   b. a plurality of counters, one counter for each block, to count each time its associated block is erased, wherein a programmable maximum value is applied to all the blocks;
   c. a plurality of erase inhibit flags, each flag having a set condition and an unset condition, one flag for each block, wherein the flag for a block having a count value equal to the maximum value is set to prevent further erasing of that block;
   d. a controller to switch data in a block having a relatively small count value into a block having the maximum value; and
   e. an erase element to clear all counters and all flags once all flags are set.

20. The device according to claim 19 further comprising:
   a. means for determining whether the counter for any erased block is equal to the maximum count value;
   b. means for finding a block having a count value less than the maximum count value; and
   c. means for moving the block having a count value less than the maximum count value into an erased block having its counter equal to the maximum count value.

21. The device according to claim 20 further comprising means for finding a block having a then least counter value and moving that block into the erased block having its counter equal to the maximum count value.

22. The device according to claim 21 wherein the blocks, the counter and the flag are formed of flash memory cells.

23. The device according to claim 21 wherein the blocks, the counter and the flag are formed of $E^2PROM$ cells.

24. A method of maintaining parity of erase cycles amongst storage blocks in a non-volatile semiconductor mass storage device having a plurality of non-volatile storage blocks, wherein each block is selectively programmable to store data and is selectively erasable and further wherein each block has a finite number of erase cycle lifetimes, the method comprising;
   a. counting and maintaining a count value for each block representing each time it is erased;
   b. setting a predetermined maximum value;
   c. preventing an erase cycle from being performed on a block having a count value equal to the maximum value;
   d. switching data from a block having a smallest count value into a block having the maximum value; and
   e. erasing the count values once all blocks have been erased the maximum value of times.

* * * * *

UNITED STATES PATENT AND TRADEMARK OFFICE
CERTIFICATE OF CORRECTION

PATENT NO. : 5,388,083
DATED : February 7, 1995
INVENTOR(S) : Mahmud Assar *et al.*

It is certified that error appears in the above-identified patent and that said Letters Patent is hereby corrected as shown below:

On the cover page, line 3 of block [75], please delete "Pleasonton" and replace with --Pleasanton--.

On the cover page, line 2 of block [56], please delete "Tanra" and replace with --Taura--.

On the cover page, line 13 of block [56], please delete "185" and replace with --218--.

On the cover page, line 9 of block [57], please insert --a-- before the word "hard".

Signed and Sealed this

Thirtieth Day of May, 1995

*Attest:*

BRUCE LEHMAN

*Attesting Officer*       *Commissioner of Patents and Trademarks*